United States Patent [19]

Jacobowitz et al.

[11] Patent Number: 5,481,573
[45] Date of Patent: Jan. 2, 1996

[54] SYNCHRONOUS CLOCK DISTRIBUTION SYSTEM

[75] Inventors: Lawrence Jacobowitz, Poughkeepsie; Daniel Stigliani, Jr., Hopwell Junction, both of N.Y.

[73] Assignee: International Business Machines Corporation, Armonk, N.Y.

[21] Appl. No.: 904,761

[22] Filed: Jun. 26, 1992

[51] Int. Cl.$^6$ ............................................. H04L 7/00
[52] U.S. Cl. ...................... 375/356; 375/376; 327/149; 327/150; 327/153; 327/159; 327/163; 327/231; 327/291; 331/17; 331/25; 395/550
[58] Field of Search ............................ 307/269; 331/17, 331/18, 25, 34, 110; 375/119, 120, 354, 356, 370, 373, 375, 376; 328/19, 63, 62, 172, 105, 155, 333; 455/260; 370/112, 105; 395/550; 327/141, 162, 161, 291, 293, 149–153

[56] References Cited

U.S. PATENT DOCUMENTS

| | | | |
|---|---|---|---|
| 3,812,468 | 5/1974 | Wollum et al. | 340/172.5 |
| 3,940,558 | 2/1976 | Gabbard et al. | 325/58 |
| 3,983,501 | 9/1976 | Lindstrum | 331/17 |
| 4,185,245 | 1/1980 | Fellinger et al. | 328/103 |
| 4,482,819 | 11/1984 | Oza et al. | 307/269 |
| 4,495,614 | 1/1985 | Aro et al. | 370/58 |
| 4,560,939 | 12/1985 | DeKarske et al. | 328/72 |
| 4,686,482 | 8/1987 | Zoetman et al. | 328/164 |
| 4,691,126 | 9/1987 | Splett et al. | 307/441 |
| 4,691,176 | 9/1987 | Hsiung et al. | 331/17 |
| 4,694,472 | 9/1987 | Torok et al. | 375/107 |
| 4,754,164 | 6/1988 | Flora et al. | 307/269 |
| 4,755,704 | 7/1988 | Flora et al. | 307/269 |
| 4,757,264 | 7/1988 | Lee et al. | 328/63 |
| 4,761,567 | 8/1988 | Walters, Jr. et al. | 307/269 |
| 4,847,516 | 7/1989 | Fujita et al. | 307/269 |
| 5,125,009 | 6/1992 | DeVilbiss | 375/356 |
| 5,194,828 | 3/1993 | Kato et al. | 375/120 |
| 5,216,671 | 6/1993 | Nutter | 370/112 |
| 5,291,144 | 3/1994 | Ichiyoshi | 375/120 |
| 5,313,503 | 5/1994 | Jones et al. | 375/120 |
| 5,345,449 | 9/1994 | Buckingham et al. | 370/112 |
| 5,359,727 | 10/1994 | Kunta et al. | 395/550 |

OTHER PUBLICATIONS

"SAW Bandpass Filters"; Andersen Laboratories; Handbook of Acoustic Signal Processing, vol. 1; Fifth Edition; pp. 1–2.
"SAW Questions and Andersens"; Andersen Laboratories (Brochure).
"Voltage–Controlled Crystal Oscillators"; AT&T; Application Notes; Nov. 1985.
"157–Type VHF Voltage Controlled Crystal Oscillator"; AT&T data Sheet, pp. 1 & 2.

*Primary Examiner*—Stephen Chin
*Assistant Examiner*—Amanda T. Le
*Attorney, Agent, or Firm*—Whitham, Curtis, Whitham & McGinn; Ira David Blecker

[57] ABSTRACT

A clock signal distribution system for a digital electronic system operating at high clock speed and short cycle times distributes a primary clock signal which is of relatively low frequency through conventional hardware. A high frequency secondary clock signal is generated using a phase locked loop to maintain high accuracy synchronization with the primary clock. Delay means are provided for both the primary and secondary clock signals to provide compensation of propagation time or to provide desired offsets. The phase locked loop arrangements with delays can be cascaded to provide flexibility of both frequency and phase of signals throughout the system, any or all of which may be maintained in synchronism with the primary clock. A dynamic digital transfer function generator is also used within the phase locked loop to achieve particular synchronization functions. The signal distribution system can be used at any or all levels of a network or complex and partitioning of the network or complex may be done based on the articulation of the clock distribution system.

18 Claims, 3 Drawing Sheets

SYNCHRONOUS CLOCK DISTRIBUTION SYSTEM

BACKGROUND OF THE INVENTION

1. Field of the Invention

The present invention generally relates to digital electronics systems and, more particularly, to the provision of high frequency clock pulses to portions of such digital electronic systems which may be synchronized throughout each such digital electronic systems.

2. Description of the Prior Art

The performance and correct operation of complex digital circuits is critically dependent upon the timing of the signals propagated through the numerous signal paths therein. For example, even with a simple logic gate, if the arrival times of the inputs are skewed in time, the correct output will be produced only during the overlap, if any, of the correct logic states of the input signals. For this reason, the operation of digital circuits is periodically reclocked at intervals referred to as a cycle time. This cycle time is usually determined by a system clock which produces clock signals of different phases to allow for signal propagation and settling times to assure that all signals are in the intended logic state when the various digital circuits are permitted to respond thereto. However, since the cycle times must accommodate all propagation delays and other signal distortion and settling times within the system, the clock cycle must often accommodate the largest delay therein. The cycle time thus imposes this delay on the entirety of the system and therefore limits the operational speed of the entire system.

For the same reasons, the key to improving system speed has been to reduce the propagation times of the individual elements of the digital circuit. This has been quite successful over the years, yielding individual element signal propagation times on the order of 0.1–1.0 nanoseconds and a corresponding cycle time on the order of less than 1 and up to 10 nanoseconds. This cycle time corresponds to a clock rates of 100 Megahertz well into the Gigahertz range.

A problem is encountered, however, in the distribution of clock signals since they must be propagated throughout the entire system to maintain system synchronization, as opposed to the mere clocking of circuits on a single chip, module, card or board where clock signals may be regenerated and propagation paths are limited to a very few inches, at most. Further, the longer system clock signal paths are subject to noise and distortion and may include connections which accentuate these effects, such as inductance which may delay and distort the signal propagation therethrough. Also, line termination impedance mismatch becomes more critical at higher frequencies, causing further distortion. An example of such a connection which exhibits substantial inductance while being otherwise exceptionally reliable, especially for such modular packages as the thermal conduction module (TCM), manufactured by the assignee of the present invention, is the Harcon connector.

Noise and signal propagation delay minimization is therefore achieved by designing the system master oscillator to run at the lowest frequency that synchronous distribution permits in view of the desired system speed. In other words, local, high speed clocks must receive a synchronizing signal from a system synchronizing means at at least a minimum frequency or maximum interval depending on the required accuracy of system synchronization. Conversely, for a given accuracy of system synchronization, the minimum frequency of the synchronization signal must be increased with increasing local, high speed clock rate.

As with the above mentioned connector, difficulties generally begin to arise with clock or synchronization signal frequencies equal to or greater than 100 MHz. It should be understood in this regard that variations in the reactive electrical characteristics of a particular structure, such as a particular parasitic capacitance will have greater effect with increasing frequency. Therefore since parasitic electrical effects often cannot be predicted with precision, the behavior of a particular circuit element becomes less predictable with increasing frequency. However, at the present state of the art, it can be assumed that the behavior of electrical device at 100 MHz and below is well-understood, predictable and highly reliable.

Some electronic construction techniques such as dedicated plane pairs, differential lines, pad-on-pad connectors, shielding and the like are somewhat helpful in reducing noise and propagation delays of clock signals but are neither optimum nor space efficient. Often, such techniques are simply not economically feasible in certain products or cannot be used because of mechanical constraints such as weight or size. Further, connections employing these techniques often would require design modifications which are impractical, costly or require different designs of the same type of electronic component, such as with a particular connector, to accommodate each of several different noise and signal delay techniques. Therefore, even using conventional noise protection techniques, unacceptable noise levels and propagation delays can be anticipated at clock rates of 250 MHz or higher.

Attempts at clock signal regeneration, recovery or reconstruction have been somewhat less successful. Most such techniques involve the prediction or measurement of clock signal propagation delay at a particular point of the system and providing a further delay to cause the regenerated clock signal to coincide with the original clock signal or to have a predetermined offset with respect thereto which will allow proper function of the associated part of the system. However, since these delayed clock signals add a delay which is only controllable during design and which is also subject to noise, such arrangements are not particularly stable and may propagate noise as delay and cause erroneous function of the associated logic. Clock recovery from the input signals is only successful to the extent of providing a clock signal which is generally correct as to the digital signals from which they are recovered. However, such recovered clock signals are not synchronized with the system and may cause anomalous system behavior due to noise and the unpredictable propagation delays which may occur in signals occurring in such portions of the system.

Phase locked loops (PLL's) have been known for many years and are the basis for the familiar process of frequency modulated transmission of radio signals. A phase locked loop is basically a technique to control the frequency of a local oscillator in a manner which will follow variations in frequency of another signal. Therefore, tuners using a phase locked loop exhibit the useful property of being able to "lock on" to a signal close to that of the oscillator or a harmonic or sub-harmonic thereof, depending on the structure of the PLL. Therefore, such tuners are somewhat self-tuning and exhibit particularly good noise immunity. In this and many other common applications of PLL's, the PLL's are basically being used to recover a synchronization signal from the communicated data, similar to the clock recovery arrangements discussed above. Therefore, since the oscillator of the PLL is synchronized to the data received, the system is only locally synchronous and does not exhibit a specific phase correlation with the "transmitter" but only the local timing of the input signal.

A phase locked loop, in its simplest form, includes a variable frequency oscillator, typically a voltage controlled oscillator, and a phase detector. The phase detector receives both an input signal and an output signal from the oscillator. Either the input signal or the oscillator output may be frequency divided depending on whether it is desired for the PLL oscillator to operate at a multiple (e.g. harmonic) or sub-multiple (e.g. sub-harmonic) of the input signal. The phase detector compares the phase of the input signal and the oscillator output and generates a signal (e.g. voltage) having an amplitude corresponding to the phase error detected therebetween to control the oscillation frequency of the variable frequency oscillator. The output of the phase detector is typically low pass-filtered to smooth the error signal and thus stabilize the operation of the voltage controlled oscillator.

Because of the many applications of PLL's in communication systems, many developments and refinements of PLL's have been developed and at the present state of the art, extremely good performance and accurate tracking of an input signal is readily available. For example, low-pass filter circuits for the purpose of stabilizing oscillator operation now preferably include damping to optimize the tracking of the input signal by the oscillator and to avoid overshoot and "hunting". Therefore, PLL's can presently provide excellent tracking of an input signal.

SUMMARY OF THE INVENTION

It is therefore an object of the present invention to provide for system clock rates synchronized throughout the system at frequencies above 250 MHz which are compatible with existing connector technology and requires no design changes in the mechanical design of boards, cards modules or chips which make up the system.

It is another object of the present invention to provide for system synchronization which is stable at the chip level and above and allows for the generation of multi-phased clocks.

In order to accomplish these and other objects of the invention, a clock signal distribution system is provided for an electronic system including a primary clock operating at a predetermined primary frequency, a primary clock signal distribution system for distributing the primary clock signal to at least one component of the electronic system, wherein that at least one component includes a phase locked loop including an oscillator operating at a secondary frequency, and maintaining synchronization of the secondary frequency with the primary frequency, and means for distributing the secondary frequency to at least one element of the system within the component.

In accordance with another aspect of the invention, a clock signal distribution system is provided for an electronic system including a primary clock operating at a predetermined primary frequency, a primary clock signal distribution system for distributing said primary clock signal to at least one component of the electronic system, said at least one component including a phase locked loop including an oscillator operating at a secondary frequency and a dynamic digital transform means for providing a dynamically variable transfer function between a phase detector and the oscillator in the phase locked loop, the phase locked loop maintaining synchronization of said secondary frequency with said primary frequency under control of the dynamic digital transform means, and means for distributing the secondary frequency to at least one element of the system within the component.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
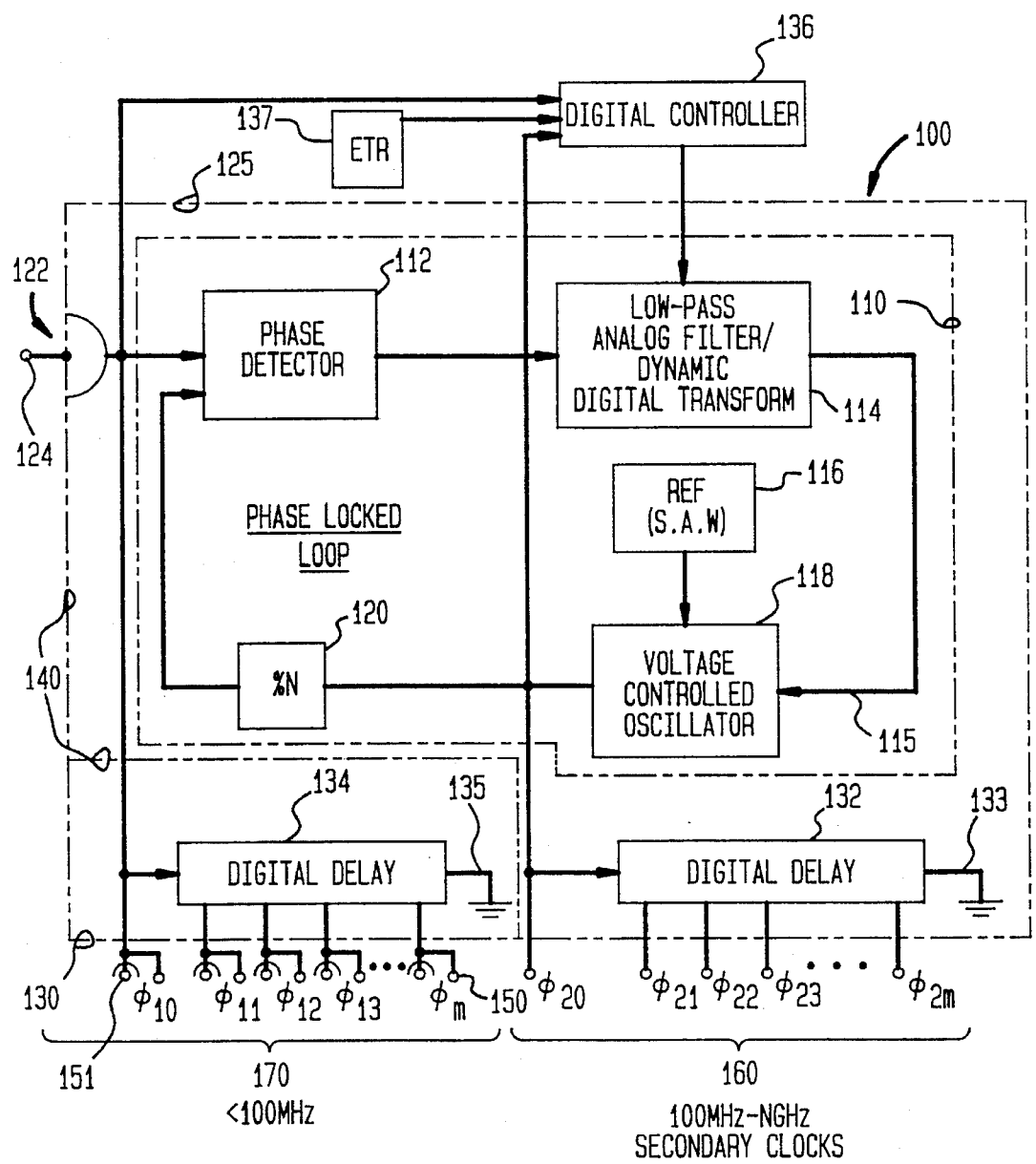
FIG. 1 is a schematic illustration of the application of the invention to a component (e.g. a chip, module, card or board) of an electronic digital system.

Referring now to the drawings, and more particularly to FIG. 1, there is shown a schematic diagram of the basic form of the present invention. The present invention may be most concisely described as providing one or more secondary or local clocks, possibly in cascade, which operate at a desired clock cycle time synchronized with a primary or master clock signal which can be reliably distributed over a system having a predetermined, limited, bandwidth with a known propagation time and low noise at lower frequencies wherein the desired high frequency, possibly beyond the bandwidth of the distribution system for the primary clock signal is generated and synchronization maintained by means of a phase locked loop. The secondary clocks are an arbitrary multiple of the primary clock frequency and may thus be extended or upgraded to the Gigahertz range of frequencies by the mere expedient of provision of frequency division by larger numbers in the PLL.

The overall arrangement 100 includes a phase locked loop indicated by dashed line 110. The phase locked loop includes a phase detector 112, a low pass filter 114 which is preferably critically damped, a voltage controlled oscillator 118 including a frequency reference 116 to establish a reference frequency in the vicinity of which, frequency control may be exerted in response to an input voltage 115, and a frequency divider to reduce the oscillator frequency signal to a signal near the frequency of the signal input to the phase detector 112. A surface acoustic wave frequency reference is preferred to a crystal or other types of frequency reference since such a device is able to extend the frequency of PLL's to well in excess of 4 GHz whereas PLL's are otherwise generally limited to about 500 MHz or less. It should be noted that the low pass filter 114 integrates the phase error over a plurality of the input clock signal periods and thus provides an extremely stable control of the operation of the voltage controlled oscillator. The loop oscillator phase error response should be critically damped at low pass filter 114 to achieve fast tracking response.

The function of filter 114 can be realized with an analog circuit element or a dynamic digital transform means such as can be provided by digital logic circuit function. A digital logic circuit is, in fact, preferred since such an arrangement provides more flexibility to control and optimize the transfer function between the phase detector 112 and controllable oscillator 118 in order to achieve a desired derived clock frequency. As depicted in FIG. 1, the transfer function can be adjusted dynamically during system operation to yield an optimum derived clock frequency even in the presence of primary clock variation as well as delay and distortion.

This is accomplished with the digital controller 136 which preferably contains structure functioning as one or more frequency counters (e.g. a timed reset pulse counter) and a special purpose microprocessor. For example, a transform processor such as a fast Fourier transform, Laplace transform or other special function processor could advantageously be used to dynamically generate the transfer function. This configuration can also provide for monitoring the frequency of either or both the primary and derived secondary clocks and/or an external time reference (ETR) 137 and alter the transfer function to achieve a desired function such as an absolute derived frequency.

Otherwise, the operation of the phase locked loop is very simple and very well understood in the art and need not be discussed in detail since the particular details of the phase locked loop are not critical to the practice of the invention. In summary, the oscillator 118 will operate at a frequency near that determined by the reference device 116. The frequency divider 120 divides the frequency of the output of oscillator 118 by a desired value which is preferably an integral power of two for simplicity of design (in which case, the frequency divider may simply be a cascaded series of bistable devices of flip-flops) to a frequency close to that of the reference master clock signal input at 124. A Harcon connector 122 is shown interposed in this input line to reflect the preferred implementation of the invention on a chip or module, indicated generally by dashed line 125, to which connections are made through conventional hardware. The input signal, therefore, is preferably of a frequency which can be reliably and predictably communicated through such hardware.

Phase detector 112 compares the phase of the input signal 124 and the frequency divided output of voltage controlled oscillator 118 and produces a voltage in response thereto, the magnitude of which reflect the phase difference or error between the two signals. This voltage is then low pass filtered at 114 and applied to a control input of the voltage controlled oscillator 118. Since this is a closed loop system, the error signal will cause the oscillator frequency to change until the phase difference between the oscillator and the input (primary) clock signal is reduced to zero.

In the general application of the invention, particularly to modular circuitry in which a module 125 may contain many chips including one or more clock chips indicated by dashed lines 140 and a master clock chip indicated by dashed line 130, a delay means 132, such as a delay line, is also provided with the output of voltage controlled oscillator 118. This delay means may be of any desired structure and is terminated as generally indicated by ground connection 133. Preferably, however, the delay means will be constructed as a serial arrangement of logic gates, each constituting an element or unit of the delay and having a predetermined propagation time such as 100 picoseconds. Of course, several such gates could be considered as a single element of the delay, depending on the delay resolution desired. Alternatively, the propagation time of each gate could be adjusted during manufacture to provide any desired delay. The number of stages of delay 132 is arbitrary but need not provide a total delay greater than the period of the primary clock 124. The respective outputs of the circuit 100, including the outputs of delay 132, are designated $\phi_{20}$ (the subscript "2" indicating the secondary clock frequency and the units digit of the subscript indicating the relative phase shift), $\phi_{21}$, $\phi_{22}$, $\phi_{23}, \ldots, \phi_{2n}$, which may be output to other circuitry on the clock chip or to other chips on the module. It should be noted in this regard that such other chips are typically mounted on the module by soldering or other connection or attachment techniques which can reliably carry very high frequency signals. Therefore, distribution of clock signals within the module need not and would not ordinarily involve hardware connections such as the above-mentioned Harcon connector. Individual chips may receive clock signals at two or more different phases, as their functions require. Also, either in the clock chip or in the individual other chips, inverter structures may be provided to supply clock signals of any phase or phases at both true and inverse logic levels as is often required. This inverter structure is conventional and illustration is omitted in the interest of clarity.

The module, of course, may have several clock chips and one of these clock chips may be designated as a master clock chip. This may also be the case for a board or cards which may contain one or more modules. For example, a set of modules may be used together to form a processor. In either of these cases, the master clock may have a further delay 134 (with termination 135) which receives an input directly from the primary clock 124. Delay 134 is in all other respects identical to delay 132. The outputs thereof are also identical and exhibit the same relative delays except that the output signals 170 will be at the primary frequency rather than the secondary frequency and, hence are designated $\phi_{10}$ (the subscript "1" indicating the primary clock frequency and the units digit of the subscript indicating the relative phase shift), $\phi_{11}, \phi_{12}, \phi_{13}, \ldots, \phi_{1n}$. These signals may be used by other clock chips within the module through connections such as 150 or communicated to other modules through hardware connectors such as 151 (e.g. Harcon connectors).

Figure 2:
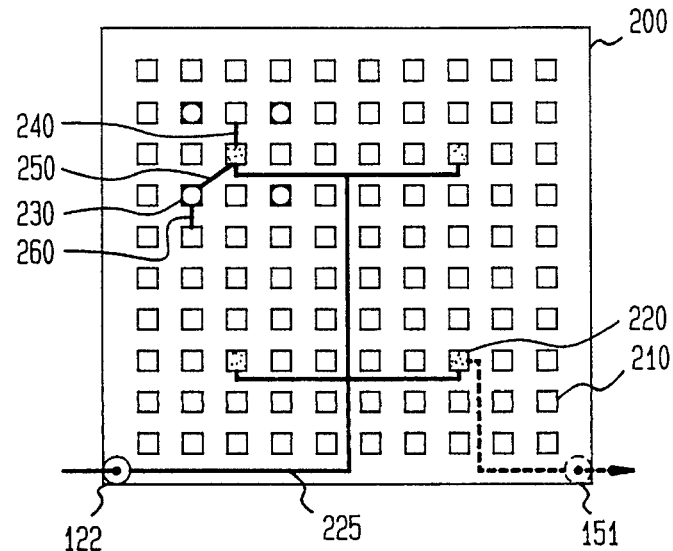
FIG. 2 is a schematic illustration of a preferred arrangement for distribution of clock signals for a multi-chip module.

Referring now to FIG. 2, a layout of a modular component 200 containing an arbitrary number (here illustrated as one hundred) chips 210 is shown. To minimize propagation delays within the module, four clock chips 220 are centrally provided in each quadrant of the module. The number of such clock chips is not critical to the practice of the invention and should be regarded as an incident of module design. An input 122 for the system clock at the primary frequency is provided and the system clock is distributed to the four clock chips 220 over connections 225. As indicated above, outputs 160 are distributed to other chips as shown at 240. To achieve phase offsets or other frequencies or both, some outputs can also be connected to slaved clock chips 230 as indicated at 250 and the outputs thereof may, in turn be connected to selected other chips as shown at 260. These additional connections and clocks form an important aspect of the present invention and provide substantial flexibility of circuit design by cascading the implementation of the invention as will be discussed in more detail in connection with FIG. 3.

Figure 3:
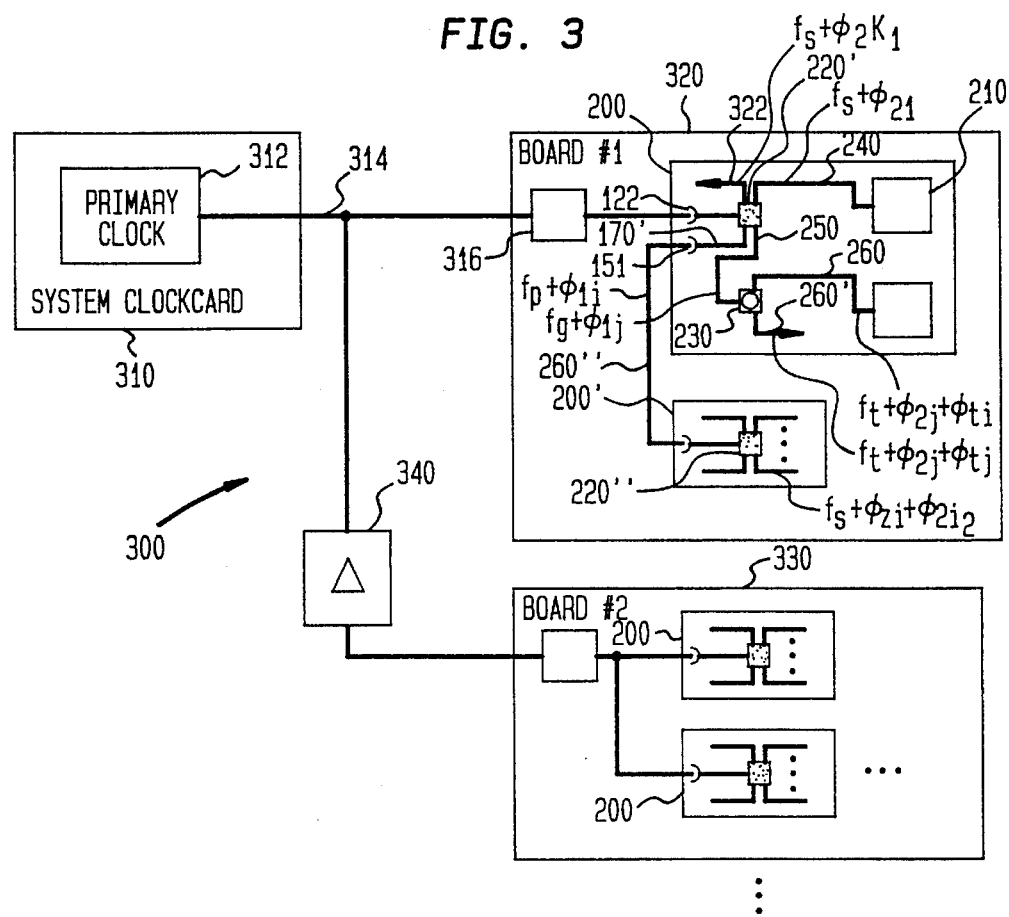
FIG. 3 is a schematic diagram of showing several preferred applications of the invention to a portion of a digital electronic system including a plurality of modules.

FIG. 3 depicts a generalized implementation of the invention within a system 300. In system 300, a system clock card 310 or similar structure is provided to include primary clock 312. The primary clock signal 314 is distributed throughout the system by connections 314 and input to other boards 320, 330 by a connection 316 which would preferably be formed as an edge connection and may include a precision timing element (PTE) to locally adjust the phase of the input clock signal either for deskewing or for providing an intentional offset. Since the primary clock signal is preferably less than 100 MHz in accordance with the invention, the propagation time can be accurately predicted or measured and will be very stable. Therefore, phase adjustments can be made at the PTE to compensate for the propagation time or to provide for other functions of the board. The primary clock signal is then distributed to modular circuits 200 or chips as may be desired. At selected modular circuits 200, the primary clock signal is distributed as generally indicated in FIG. 2 and the necessary higher secondary frequency is developed as shown in FIG. 1. FIG. 3 details variations of the distribution of both the primary and secondary clock signals. For example, as an alternative or adjunct to the use of a PTE for the board, a delay 340 can be imposed at the system level or any level higher than that of the board to deskew or provide a phase offset for the board 330 which, in turn, distributes the delayed clock to a plurality of modules 200.

However, the full flexibility of the clock signal distribution arrangement in accordance with the invention will become apparent from consideration of connections illustrated in regard to board 320 in FIG. 3 which may also contain distribution to other chips or modules similar to that illustrated on board 330, with or without additional delay 340. It should be understood that the arrangement shown on board 320 is merely exemplary but is particularly applicable to arrangements where a particular circuit such as a processor is formed of plural modular components.

Figure 4:
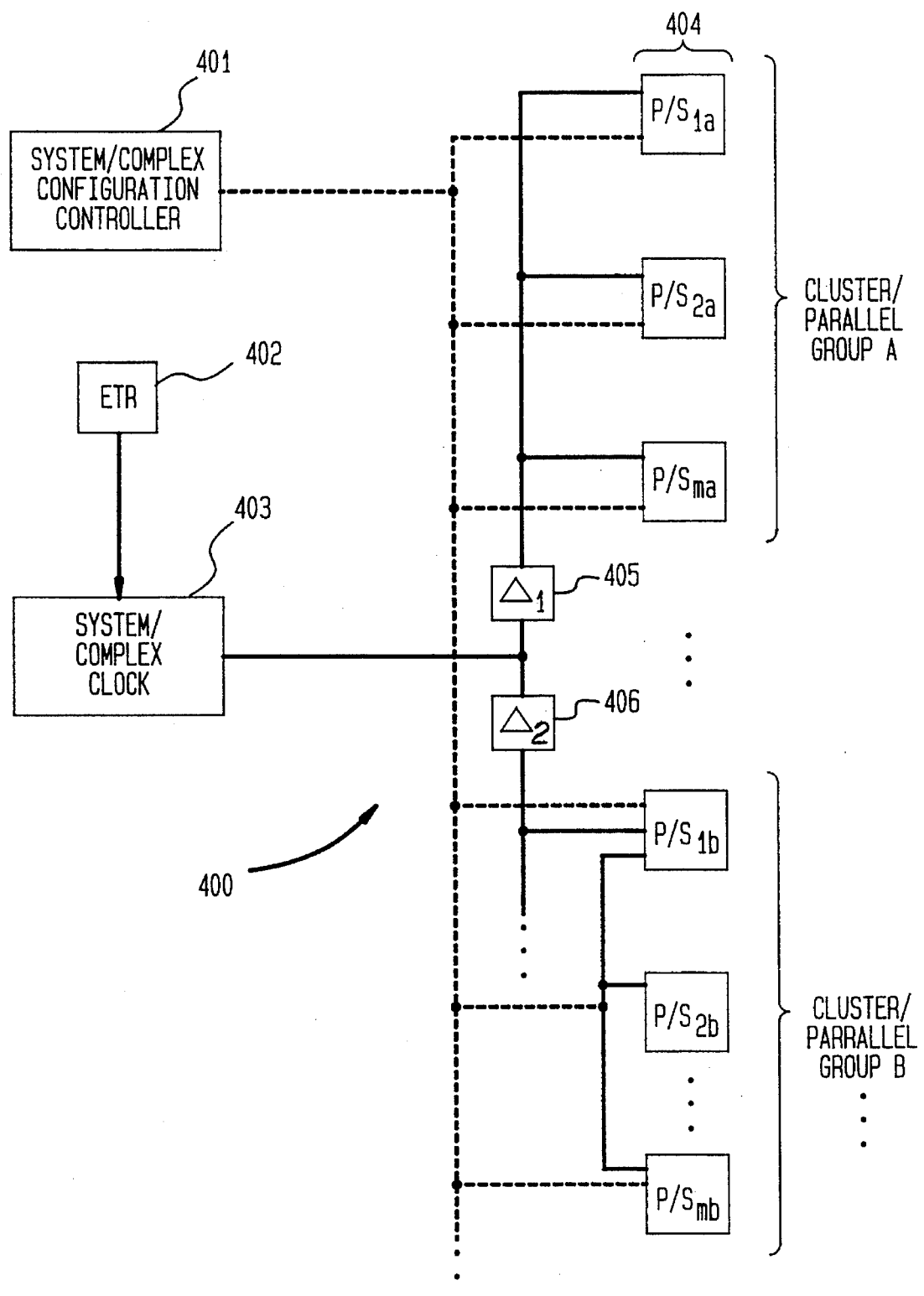
FIG. 4 is a schematic diagram illustrating application of the invention to a network or system complex.

Specifically, on board 320, one particular module 200 contains a master clock 220' which is similar to FIG. 1 including delay 134. One set of outputs 160 is communicated over connection 240 to a plurality of chips (e.g. 210) on the module. A similar connection could be made by connection 322 to a different plurality of chips. Of course, there could also be overlap of some of the connections to the groups of chips. For example, one group could receive signals $\phi_{20}$ and $\phi_{2n}$ while another group of chips could receive signals $\phi_{23}$ and $\phi_{2n'}$. The signals on connections 240 and 322 therefore differ in the phases of the signals which may be present therein. For example, signals on connection 240 would at least contain signals which are characterized by f, and $\phi_k$ and signals on line 322 would at least contain signals which are characterized by f, and $\phi_1$. The same would be true for connection 250 which would at least contain signals which are characterized by $f_s$ and $\phi_j$. However, in this case, connection 250 connects (e.g. in cascade) this secondary clock signal to a further clock circuit 230 in accordance with the invention as shown in FIG. 1 and which may be on the same or a different chip. This further clock circuit can again multiply the frequency by an integral or other amount in dependence on the value of N in frequency divider 120 and add a further phase adjustment. It should be noted in this regard that circuits for frequency division by non-integral numbers (e.g. 2½) are known in the art and are equally applicable to the invention. Therefore this tertiary frequency could be generally characterized by $f_t$, $\phi_i$ and $\phi_{ti}$, the "t" term in the subscript indicating the further delay imposed by the further PLL clock circuit 230, as shown at 260. Other delays would also be available at frequency $f_t$ such as $\phi_{tj}$, shown at 260'. This cascading of PLL clock circuits could be continued indefinitely as desired and limited only by the ultimate frequency which can be communicated within a module. There also may be some performance advantages in synchronization accuracy in developing a high frequency over a plurality of PLL stages. However, particularly important applications of such cascaded PLL's are in connection with multi-processor applications on either local or wide area networks, an exemplary arrangement 400 of which is schematically illustrated in FIG. 4, where a plurality of workstation processors or digital data processing systems 404 are reconfigurable (e.g. partitioned) for parallel processing during particular operations or to achieve such other functions as workload redistribution in order to increase the efficiency of the system or complex. In such an application, a system complex clock signal source 403, which may be responsive to an external time reference 402 serves as the primary clock source for at least a portion of the system, network or complex, much in the manner of primary clock 312 of FIG. 3. Although in a large system, propagation of clock signals may cause different delays such as at 405 and 406, groups of processors, groups of systems, etc., such as P/S1a, P/S2a, . . . P/Sbn grouped into respective cluster/parallel groups A and B, may be commonly synchronized within groups and from group to group through the use of the invention as shown in FIG. 3 and extended to other hierarchical levels by FIG. 4. Such a system or complex will also include some discrete or distributed arrangement 401 for configuring or partitioning the system, network or complex for purposes of parallel processing, workload redistribution, etc. This configuration controller could be arranged within the level of the present state of the art and in view of this disclosure to perform such partitioning based on the connections of the clock distribution system in accordance with the invention to group processors or systems forming clusters thereof which are precisely synchronized with each other by the hardware of the clock signal distribution system. Alternatively, the configuration controller 401 could also control switching of the primary and or secondary clock signals to form synchronized groups or clusters in accordance with the data processing operations to be accomplished. The processors or systems or combinations thereof, collectively referred to as systems, can thus be grouped according to the hierarchical array of cascaded PLL's in order to exploit the synchronized operation of a plurality of local clocks which, because of the local cascading of PLL's, are more tightly synchronized to a local oscillator (e.g. 220) than to the system clock.

Another important application is in connection with an external timing reference (ETR) which is used to associate a master clock time stamp with files or other data. As an incident of the low noise and the network hierarchy provided by cascading of PLL's, the application of such ETR's can be extended from functional units, such as modules, to processors and networks. Implementation of these and other applications of cascaded PLL based time signal sources will become evident to those skilled in the art in view of the foregoing description where the improved synchronization, reduction of distortion and flexible control of delays may be advantageously utilized.

Further in accordance with the invention and as variations on the above discussed applications of the invention, it may be advantageous to insure that all modules constituting a functional group be synchronized through a single connection on the board 320. For this purpose, all or selected ones of outputs 170, collectively indicated at 170' may be taken from master clock 220' with desired delays or relative phases but at primary frequency $f_p$. These are communicated out of the module and to another module 200' or chip through connectors such as 151 and connection 260, the propagation time of which can be compensated or further offset by the particular phase or phases selected from among outputs 170. Of course, module 200' could also include further clock chips beyond 220'' corresponding to 230 in module 200, and so on. It also follows that primary frequency signals such as appear on connection 260 could also be led off of board #1 to other boards with the PLL clock circuit of the invention functioning as a phase correcting repeater for the primary clock signal on connection 314. While this is not generally preferred, it may provide solutions to some engineering problems in large systems.

From the foregoing, it is seen that the present invention, including the cascading of the arrangement of FIG. 1 as illustrated in FIG. 3, provides not only reliable clock synchronization throughout the system, as desired, without the requirement for hardware design alteration, but also complete flexibility of choice of secondary (or tertiary) clock frequency and phase. Phase resolution may be made as small as the shortest propagation time possible through a single simple logic gate at a particular level of technology and thus is sufficient to all present digital integrated circuit technologies and those which may hereafter be developed. Further, the clock signal distribution arrangement can be integrated with other circuits on a chip and thus provide for upgrading of existing systems to higher clock rates without requiring hardware changes in the clock distribution system.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A clock signal distribution system for an electronic system including
   a primary clock operating at a predetermined primary frequency,
   a primary clock signal distribution system having a predetermined bandwidth for distributing said primary clock signal to at least one component of said electronic system, said at least one component including
   a phase locked loop including an oscillator operating at a secondary frequency outside said predetermined bandwidth and a frequency control means including a dynamic digital transform means for providing a dynamically variable transfer function between a phase detector and said oscillator in said phase locked loop, said phase locked loop maintaining synchronization of said secondary frequency with said primary frequency under control of said dynamic digital transform means, and
   means for distributing said secondary frequency to at least one element of said system within said component as a secondary clock signal.

2. A clock signal distribution system as recited in claim 1, further including means for adjusting the phase of said primary clock signal to produce a primary clock signal having adjusted phase.

3. A clock signal distribution system as recited in claim 2, further including means for distributing said primary clock signal having adjusted phase.

4. A clock signal distribution system as recited in claim 1, further including means for adjusting the phase of said secondary clock signal to produce a secondary clock signal having adjusted phase.

5. A clock signal distribution system as recited in claim 2, further including means for adjusting the phase of said secondary clock signal to produce a secondary clock signal having adjusted phase.

6. A clock signal distribution system as recited in claim 3, including at least one further component including
   a further phase locked loop including an oscillator operating at a further secondary frequency, said further phase locked loop maintaining synchronization of said further secondary frequency with a primary frequency, and
   means for distributing said secondary frequency to at least one element of said system within said at least one further component.

7. A clock signal distribution system as recited in claim 6, wherein
   said phase locked loop of said at least one further component is responsive to said primary clock signal.

8. A clock signal distribution system as recited in claim 6, wherein
   said phase locked loop of said at least one further component is responsive to said primary clock signal having adjusted phase.

9. A clock signal distribution system as recited in claim 3, including at least one further component including
   a further phase locked loop including an oscillator operating at a secondary frequency, said further phase locked loop maintaining synchronization of said secondary frequency with a primary frequency, and
   means for distributing said secondary frequency to at least one element of said system within said at least one further component.

10. A clock signal distribution system as recited in claim 9, wherein
    said phase locked loop of said at least one further component is responsive to said primary clock signal.

11. A clock signal distribution system as recited in claim 9, wherein
    said phase locked loop of said at least one further component is responsive to said primary clock signal having adjusted phase.

12. A clock distribution system as recited in claim 1, wherein said at least one element of said system in said component includes
    a further phase locked loop including an oscillator operating at a further secondary frequency, said further phase locked loop maintaining synchronization of said further secondary frequency with said secondary frequency, and
    means for distributing said further secondary frequency to at least one element of said system within said at least one component.

13. A clock signal distribution system as recited in claim 12, further including means for adjusting the phase of said secondary clock signal to produce a secondary clock signal having adjusted phase.

14. A clock signal distribution system as recited in claim 12, wherein said further phase locked loop of said element is responsive to said secondary clock signal.

15. A clock signal distribution system as recited in claim 13, wherein said phase locked loop of said element is responsive to said secondary clock signal having an adjusted phase.

16. A clock signal distribution system as recited in claim 1, wherein said oscillator includes a surface acoustic wave frequency reference.

17. A clock signal distribution system as recited in claim 1, wherein said dynamic digital transform means includes a digital controller responsive to at least one of said primary clock signal, said secondary clock signal and an external time reference.

18. A clock signal distribution system as recited in claim 17, wherein said dynamic digital controller includes a function processor.

* * * * *